United States Patent [19]
Mohan

[11] Patent Number: 5,986,479
[45] Date of Patent: Nov. 16, 1999

[54] FULLY SWITCHED, CLASS-B, HIGH SPEED CURRENT AMPLIFIER DRIVER

[75] Inventor: Jitendra Mohan, Palo Alto, Calif.

[73] Assignee: National Semiconductor Corporation, Santa Clara, Calif.

[21] Appl. No.: 08/841,813

[22] Filed: May 5, 1997

[51] Int. Cl.⁶ ..................... H03K 19/094; H03K 19/086; H03K 19/20
[52] U.S. Cl. ............... 326/115; 326/83; 326/86; 326/126; 327/490; 330/257
[58] Field of Search ................. 326/86, 83, 89, 326/115, 127, 126; 327/108, 109, 489, 490, 492; 330/253, 257

[56] References Cited

U.S. PATENT DOCUMENTS

| | | | |
|---|---|---|---|
| 3,828,206 | 8/1974 | Zuk | 327/108 |
| 4,825,110 | 4/1989 | Yamaguchi et al. | 330/253 |
| 5,210,236 | 5/1993 | Takayanagi | 330/253 |
| 5,245,523 | 9/1993 | Juzswik | 363/56 |
| 5,444,410 | 8/1995 | Polhemus | 327/317 |
| 5,519,728 | 5/1996 | Kuo | 375/257 |
| 5,600,280 | 2/1997 | Zhang | 330/253 |
| 5,635,859 | 6/1997 | Yokota et al. | 326/83 |
| 5,767,699 | 6/1998 | Bosnyak et al. | 326/86 |

FOREIGN PATENT DOCUMENTS

| | | | |
|---|---|---|---|
| 0098762 | 8/1978 | Japan | 330/253 |
| 0159905 | 7/1987 | Japan | 330/253 |

*Primary Examiner*—Michael Tokar
*Assistant Examiner*—Daniel D. Chang
*Attorney, Agent, or Firm*—Limbach & Limbach L.L.P.

[57] ABSTRACT

A current amplifier driver capable of driving both 10 Base-T signalling and 100 Base signalling in a Local Area Network (LAN) includes one constant current source. A voltage controlled switch is contained in each of four vertical segment of an H-bridge circuit. Two voltage signals are applied to the switches to control the direction of current from a constant current source across a load. When one of the voltage signals is high, the other is low and two switches of the four switches turn on. The current amplifier driver sinks the constant current in a first direction, such that a voltage drop across the output nodes is positive. When the other voltage signal is high the switches that were on turn off, and the other two switches turn on to sink the constant current across the load in the opposite direction, such that a voltage drop across the output nodes is negative. When both voltage signals are low, all four switches turn off, and the output voltage is zero. In this manner, a differential signal is generated across a resistive load.

8 Claims, 7 Drawing Sheets

FULLY SWITCHED, CLASS-B, HIGH SPEED CURRENT AMPLIFIER DRIVER

BACKGROUND OF THE INVENTION

1. Field of the Invention

The present invention relates to the field of current amplifiers and in particular, to fully switched current amplifier drivers.

2. Related Art

A local-area network ("LAN") is a communication system that enables personal computers, work stations, file servers, repeaters, data terminal equipment ("DTE"), and other such information processing equipment located within a limited geographical area such as an office, a building, or a cluster of buildings to electronically transfer information among one another. Each piece of information processing equipment in the LAN communicates with other information processing equipment in the LAN by following a fixed protocol (or standard) which defines the network operation. Information processing equipment made by different suppliers can thus be readily incorporated into the LAN.

The ISO Open Systems Interconnection Basic Reference Model defines a seven-layer model for data communication in a LAN. The lowest layer in the model is the physical layer which consists of modules that specify (a) the physical media which interconnects the network, nodes and over which data is to be electronically transmitted, (b) the manner in which the network nodes interface to the physical transmission media, (c) the process for transferring data over the physical media, and (d) the protocol of the data stream.

IEEE Standard 802.3, Carrier Sense Multiple Access with Collision Detection (CSMA/CD) Access Method and Physical Layer Specifications, is one of the most widely used standards for the physical layer. Commonly referred to as Ethernet, IEEE Standard 802.3 deals with transferring data over twisted-pair cables or coaxial cables. The 10 Base-T protocol of IEEE Standard 802.3 prescribes a rate of 10 megabits/second ("Mbps") for transferring data over twisted-pair cables.

The constant need to transfer more information faster, accompanied by increases in data processing capability, necessitated an expansion to data transfer rates considerably higher than the 10-Mbps rate prescribed by the 10 Base-T protocol. As a consequence, a protocol referred to as 100 Base-T was developed for extending IEEE Standard 802.3 to accommodate data moving at an effective transfer rate of 100 Mbps through twisted-pair cables. Under the 100 Base-T protocol, certain control bits are incorporated into the data before it is placed on a twisted-pair cable. The result is that the data and control signals actually move through a twisted-pair cable at 125 Mbps.

FIG. 1 illustrates the data transmit path 100 of communication in the LAN. During data transmission, a communication unit operating on the LAN, such as a computer 117, generates a data signal T1 which is converted into differential form for transmission on the twisted pair cable 103. For 10 Base-T transmission, this data signal T1 is Manchester coded 101 to reduce electromagnetic interference and to produce square wave pulses. These pulses are then filtered 101 such that the square wave pulses are basically sinusoidal waves. These waves then go through a waveshaping filter to generate filtered differential data signals T1+/−. For 100 Base-T transmission, the data signal T1 is scrambled 119, converted to differential format 119, and MLT-3 coded 105 to generate trinary differential signals T2+/−. A 10 Base-T amplifier signal driver 107 and a 100 Base-T amplifier signal driver 109 take these differential signals T1+/− and T2+/−, respectively, and generate current-sourced differential signals T10+/− and T20+/−, respectively, to drive a primary load 105 and to transmit them on the twisted pair cable 103.

Transformer 111 isolates the twisted-pair cable 103 from the circuitry producing the transmit signals. The transformer has a primary winding 111A and a secondary winding 111B. The primary winding 111A terminates at a primary load 105 and the secondary winding terminates at a secondary load 113. The secondary load couples to a connecting unit 115, which couples to the twisted-pair cable 103. The primary winding 111A couples to a resistive load 105. It is across this resistive load 105 that either sine wave 10 Base-T signalling or MLT-3 100 Base-T signalling must be created.

Presently, amplifiers driven in a differential fashion are used to drive either the 10 Base-T signalling or the 100 Base-T signalling. An example of such a conventional amplifier circuit 200 is shown in FIG. 2. This current amplifier circuit 200 includes a resistive load 207, which is typically 100 ohms, and two terminating resistors 209, 211, each of which are typically 50 ohms. As a result, the current amplifier circuit 200 must drive not only the resistive load 207, but the termination resistors 209, 211 as well. This requires the current amplifier circuit 200 to source a significant amount of current, which requires a significant amount of power.

The current amplifier circuit 200 also includes a current source 201, typically a current mirror current source, and two voltage controlled PMOS transistors 203 and 205. The PMOS transistors 203, 205 operate in the saturation region and switch on and off when driven by signals having voltage levels between V1 and V2, which are output from voltage sources (not shown). When the voltage levels V1, V2 are applied to the gates of transistors 203 and 205 they direct current through the load resistor 207 as indicated by arrows 209 and 211. For example, to direct current through the load resistor 207 in the direction indicated by arrow 209, a voltage signal is applied to PMOS transistor 203 to turn it on, and a voltage signal is applied to PMOS transistor 205 to turn it off.

The voltage levels of both voltage signals V1 and V2 must be accurately controlled to generate the proper current. Additionally, these voltage levels must be maintained constant on both sides of the current amplifier circuit 200, and the transistors 203 and 205 must be matched. As a result, the same voltage levels are attained at both nodes OUT+ and OUT−, which levels are generated across the load resistor 207.

In addition to the large power requirement, another disadvantage of this amplifier circuit 200 is that all the transistors must be matched rather closely for the best performance to occur. At least two transistors are needed for the current source 201. These transistors (not shown), is well as the PMOS transistors 203 and 205 all must match. This is very difficult to do.

A second conventional current amplifier driver circuit is shown in FIG. 3. This amplifier driver circuit 300 uses two current sources 301, 303 to generate a voltage across a 100 ohm load resistor 305. The current sources 301, 303 are typically current mirror circuits. Similar to the amplifier driver circuit 200, the current sources 301, 303 of the amplifier driver 300 must drive the resistive load 305 as well as two 50 ohm terminating resistors 307, 309.

Typically, signal generators (not shown) provide input signals $I_{IN+/-}$ to current sources 301 and 303, respectively.

The input signals $I_{IN+/-}$ are half-wave rectified, and 180 degrees out of phase from one another, i.e., $I_{IN+}$ is 180 degrees out of phase from $I_{IN-}$. As a result, when either of the current sources 301, 303 receive a signal, that particular current source becomes active. When that current source does not receive a signal, that current source is off. The effect of this arrangement is for current sources 301 and 303 to alternate between "active" and "inactive" states, such that only one current source is active at a given time.

When current source 301 is active, the external resistors 307, 309, which are tied high, pull current through the amplifier driver circuit 300 and the resistive load 305. This operation provides a voltage drop, proportional to the current flow, across the load resistor in the direction indicated by arrow 311. For the other half of the signal cycle, current source 303 is active and current source 301 is inactive. When current source 303 is active, current is pulled through external resistors 307 and 309 and the load 305. This operation provides a voltage drop across the load resistor 305 in the direction indicated by arrow 313. The result is a composite output waveform across the load resistor 305.

There are several disadvantages to this conventional circuit 300. First, the circuit must drive current through not only the load resistor but the terminating resistors 307 and 309 as well. This current requirement commands a significant amount of power.

Second, there are problems associated with switching sources 301 and 303 on and off. It is very difficult to match the current sources 301 and 303. To match the gain of the two current sources 301, 303 exactly, not only do the transistors (not shown) used for the current source 301 have to match, but those transistors have to match the transistors (not shown) used for current source 303 as well. Therefore, at least four transistors must be matched and this is quite difficult. When the current sources 301, 303 are mismatched different voltage levels are generated across the resistive load.

Furthermore, it is difficult to attain the same voltage levels needed to switch the transistors between voltage levels V1 and V2. This too causes different voltage levels to be generated across the resistive load.

Thus, a need exists for a circuit to drive both 10 Base-T analog signals and 100 Base-T digital signals which overcomes these power consumption, matching and switching problems and which has a high switching speed (e.g., 3–5 nanoseconds or less).

SUMMARY OF INVENTION

A driver amplifier having high efficiency and high output current capability, is achieved by using voltage controlled switches to drive high currents into the load corresponding to the primary side of the transformer.

A fully-switched, high speed, current amplifier driver in accordance with one embodiment of the present invention includes a constant direct current (DC) source and four voltage controlled switches. Voltage sources output two voltage signals which drive the four switches. The two voltage signals alternate between "high" (around 5 volts or voltage supply) and "low" (around 0 volts or ground) voltage levels, but are never high at the same time. When the first voltage signal goes high, two of the four switches turn on to sink the constant current through the load resistor which pulls the voltage at the first output node low and the voltage at the second output node high. As a result, the output voltage is negative.

Then, when the other voltage signal is high the first two switches turn off and the other two switches turn on. Thus, the voltage at the first output node is pulled high and the voltage at the second output node is pulled low. As a result, the output voltage is positive. When both voltage signals go low, all four switches turn off, and the output voltage is zero. In this way, a differential signal is generated across the load.

The topology of the circuit includes four variable resistors functioning as switches, each contained in a vertical segment of an H-bridge circuit. These variable resistors are voltage controlled and the only real resistor in the circuit is the load resistor. Thus, the circuit only needs to pull enough current to generate a voltage across the load resistor. Internal biasing resistors can also be employed to set the value of the output when there is no current.

In another embodiment of the present invention a current source is employed which provides more input voltage headroom to enable a large current to be input into the circuit, and which also provides two stages of buffering to isolate the input node from the output node to reduce coupling of charge injected noise.

As a result of this architecture, this circuit has several advantages. The current steering logic path is short and fast for high speed and low distortion. Additionally, there are no asymmetry problems. Only one current source is used and the two voltage signals do not have to be matched since they are only used for switching. So, since there is only one current source, and only one load, the peak voltage value is always going to be equal to the current through the load multiplied by the resistance. Therefore, by design, there is no asymmetry in the voltage levels. Finally, there are reduced matching problems since only one current source is used and the switches do not have to be matched.

These and other features and advantages of the present invention will be understood upon consideration of the following detailed description of the invention and the accompanying drawings.

BRIEF DESCRIPTION OF THE DRAWINGS

Like reference symbols are employed in the drawings and in the description of the preferred embodiments to represent the same or similar items.

DETAILED DESCRIPTION OF THE INVENTION

Figure 1:
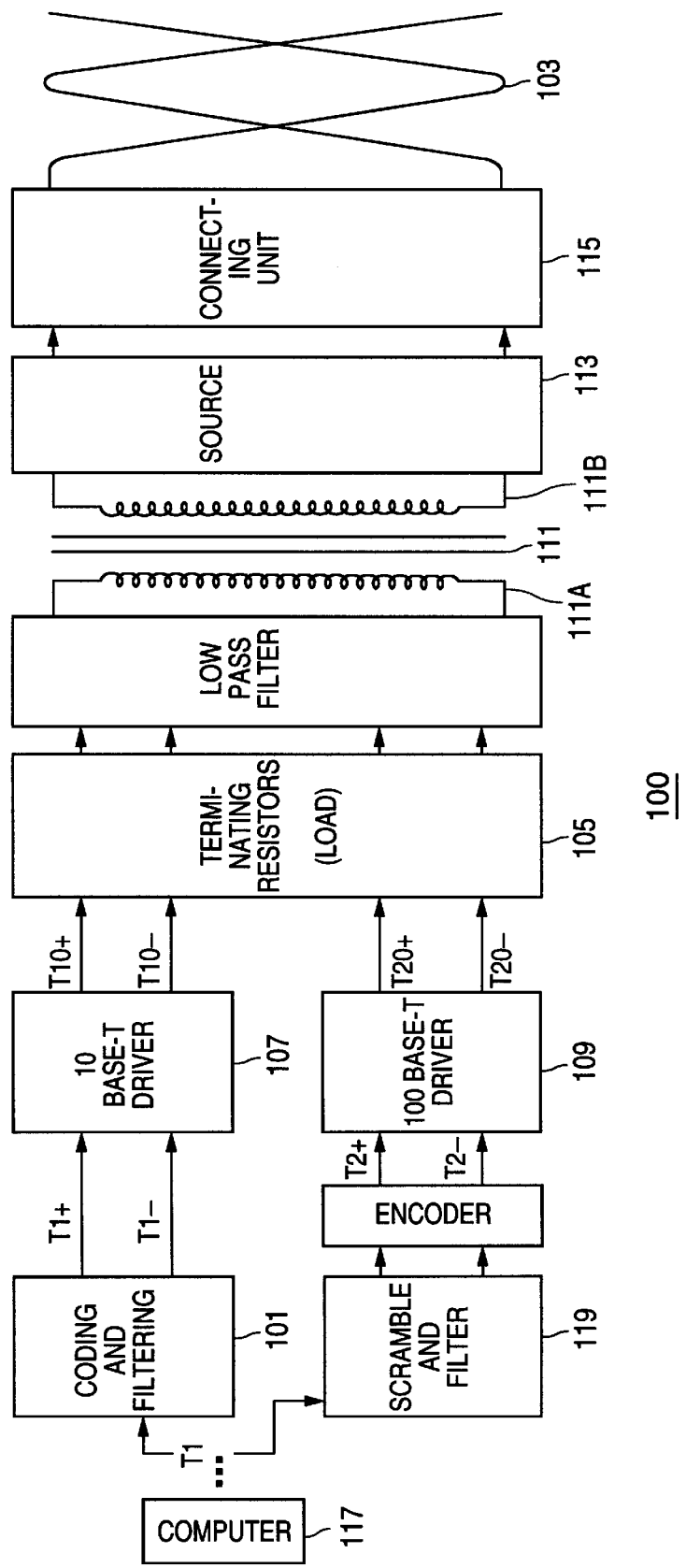
FIG. 1 illustrates a conventional LAN system configuration including a voltage amplifier driver.
Figure 2:
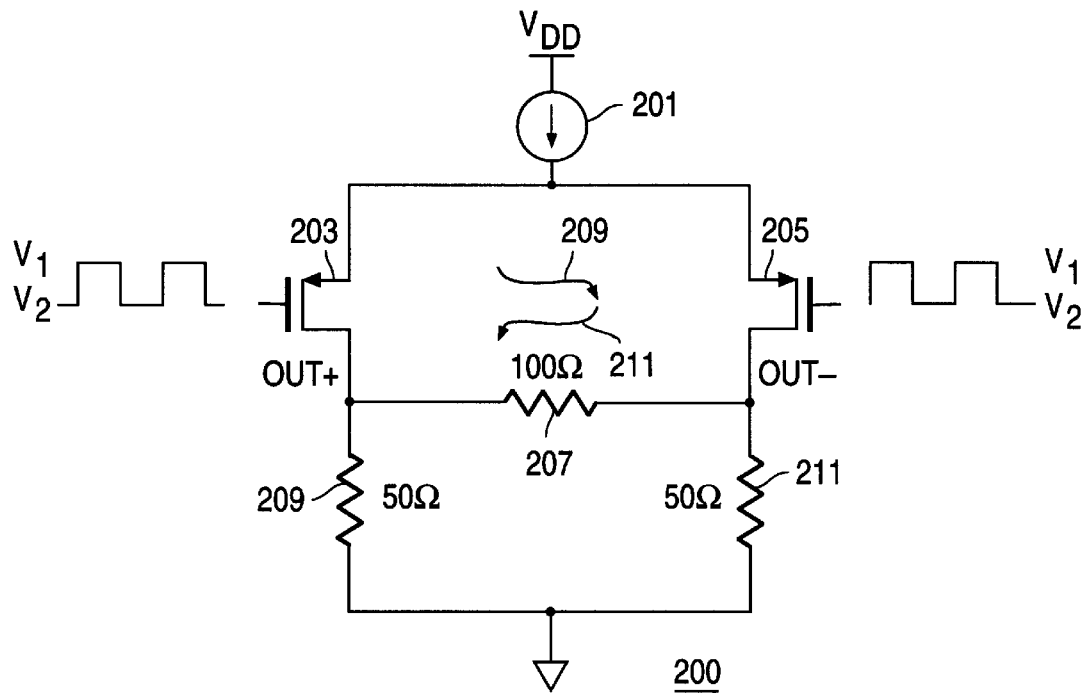
FIG. 2 illustrates a first conventional current amplifier driver circuit.
Figure 3:
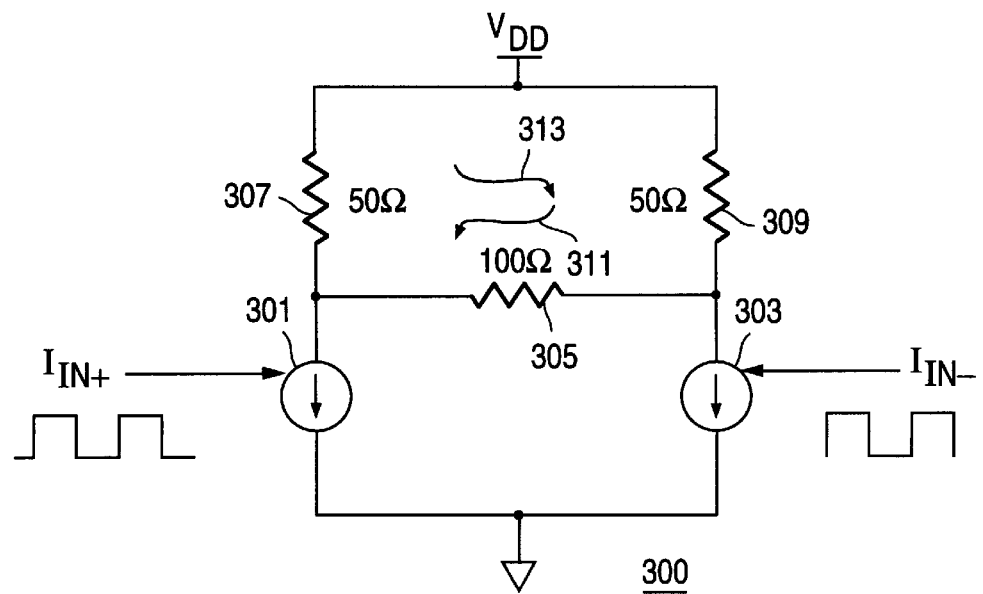
FIG. 3 illustrates a second conventional current amplifier driver circuit.
Figure 4:
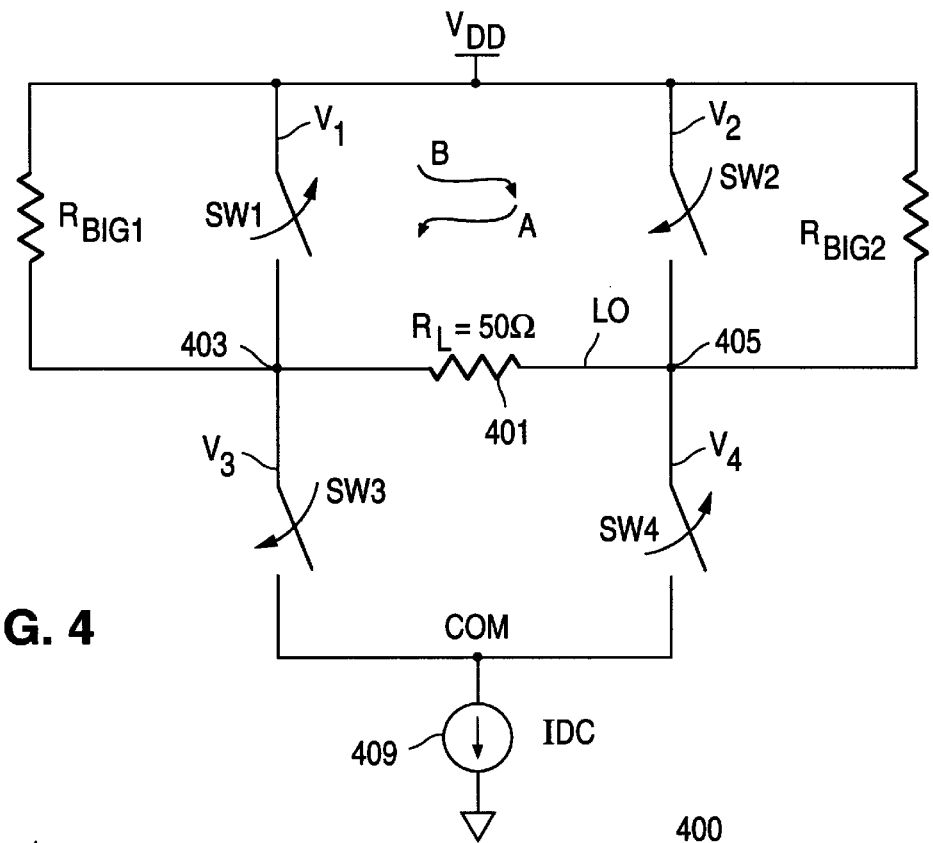
FIG. 4 illustrates a high level schematic diagram of a first embodiment of a fully switched current amplifier driver in accordance with the present invention.

In accordance with an illustrative embodiment of the invention, a common driver capable of driving both 10 Base-T and 100 Base-T signalling is shown in FIG. 4. A transformer (not shown) isolates the twisted-pair cable (not shown) from the circuitry producing the transmit signals. The transformer has a primary winding and a secondary winding. A connecting unit is connectable to a pair of lines of an outgoing twisted-pair cable so as to electrically couple the cable to the secondary winding of the transformer. The secondary winding terminates at the cable, which has a characteristic impedance of 100 ohms. The primary side of the transformer terminates at a load resistor having an impedance of 100 ohms to match the 100 ohm characteristic impedance of the twisted pair cable. It is across this resistor that either 10 Base-T sine wave signalling or 100 Base-T MLT-3 signalling must be created. The purpose of the invention is to replicate these signalling waves across the resistor load $R_L$ by generating a voltage across the resistor.

$$Vout(t) = A_i * i(t) * R_L$$

where Vout(t) is the voltage across the resistor, $A_i$ is the gain of the signal, i(t) is the input, and $R_L$ is the resistance of the load.

Another purpose of this invention is to limit the transition time of the output signal of the circuit to within 3–5 nanoseconds.

FIG. 4 shows a preferred embodiment of the high speed current amplifier 400 having a modified typical H-bridge circuit configuration. The load segment LO extends horizontally and contains the resistive load 401. This load segment LO couples between the end nodes 403, 405. Vertical segment V1 extends between left end node 403 and a voltage supply VDD. Vertical leg V2 extends between right end node 405 and voltage supply VDD. Connected between the left end node 403 and common node COM is vertical segment V3, while vertical segment V4 extends between right end node 405 and the common node COM. Coupled between the common node COM and circuit ground GND is current source 409. The reference to "vertical" and "horizontal" orientations of the segments of the modified H-bridge circuit 400 are, of course, merely for descriptive purposes and do not necessarily describe the actual layout of the circuit 400.

Each of the vertical segments V1, V2, V3, V4 contains a respective switch SW1, SW2, SW3, SW4. These switches are controlled by signals and direct current through the load resistor 401 as indicated by arrows A and B. To direct current through the load resistor 401 in the direction indicated by arrow A, signals are applied to switches SW1 and SW4 to turn these switches on, while appropriate signals are applied to switches SW2 and SW3 to keep these switches off during this time. Conversely, to direct current through the resistive load 401 in the direction indicated by arrow B, signals are applied to switches SW2 and SW3 to make them conduct, while the other switches SW1 and SW4 are kept off during this time.

In the preferred embodiment of the current amplifier driver 400, switches SW1 and SW2 are in parallel with resistors RBIG1 and RBIG2, respectively. These resistors RBIG1 and RBIG2 are biasing resistors which can be employed to set the value of the output when there is no current flowing through the switches SW1–SW4. When all of the switches SW1–SW4 are completely turned off, the biasing resistors provide a high impedance path to voltage supply VDD.

The amplifier driver circuit 400 also includes a current source 409 which couples to the common node COM. The current source 409 is a constant DC current source. Therefore, to drive the output current to zero, all the switches SW1–SW4 are turned off. However, the current source 409 remains on all the time and starts sourcing current as soon as two of the switches SW1–SW4 are turned on. As a result, the amplifier driver circuit 400 is capable of driving high frequency current into the resistive load 401.

Figure 5:
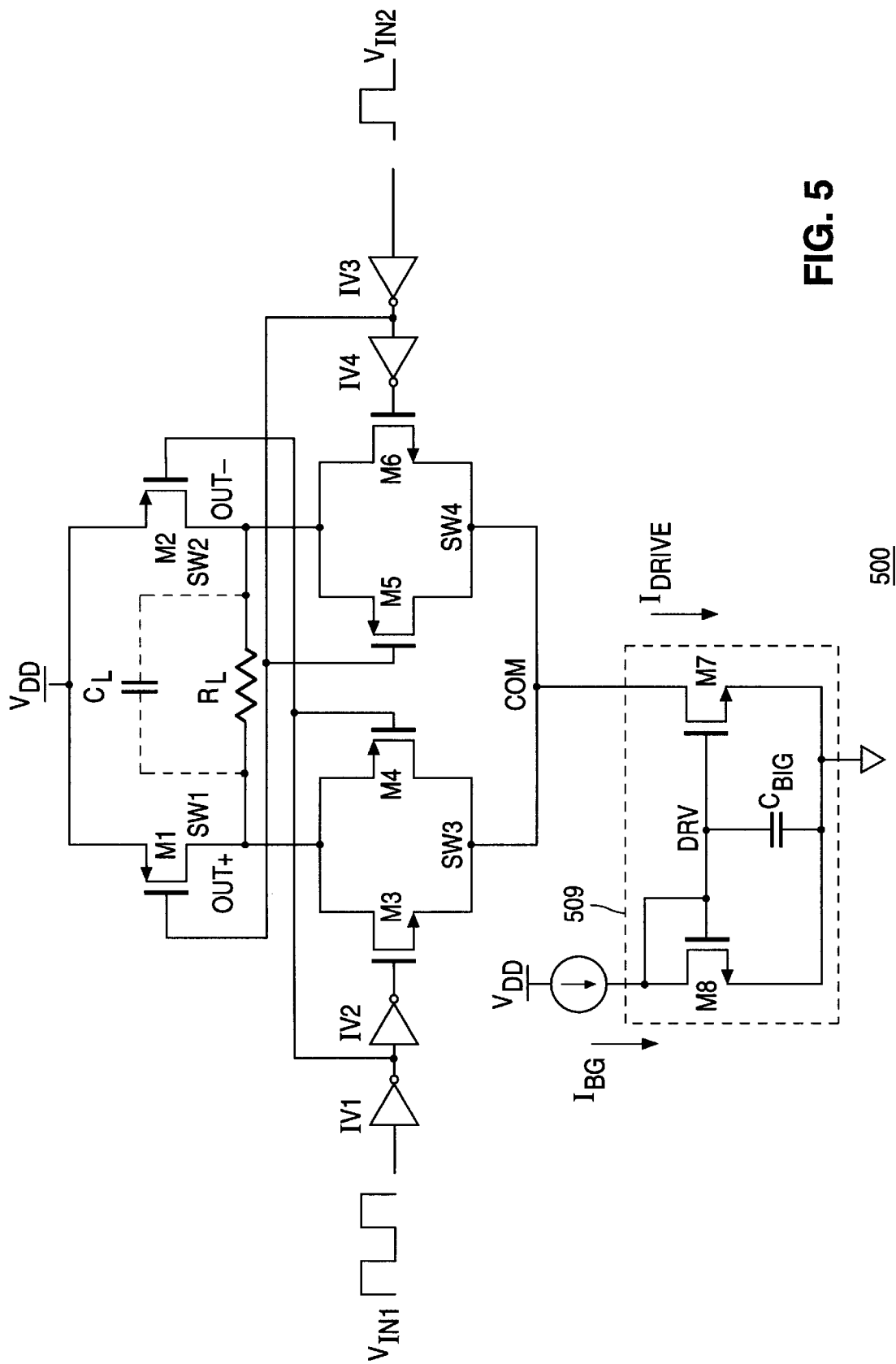
FIG. 5 illustrates a low level schematic of the first embodiment of the fully switched current amplifier driver in accordance with the present invention.

Referring now to FIG. 5, a low level schematic diagram of the current amplifier circuit 400 is shown. Current source 409 is represented by a conventional current mirror circuit 509. The gates of transistors M7 and M8 couple together, and the sources of the transistors M7, M8 couple to circuit ground GND. Therefore, the gate-to-source voltages ($V_{GS}$) of the transistors M7, M8 are equal. As a result, the output current IDRIVE through transistor M7 is equal to a gain ratio of the input direct current IBG from a bandgap circuit through transistor M8. Although current source 509 is represented by a conventional current mirror circuit, it will be appreciated that other types of current sources can be used.

P-channel metal oxide semiconductor (PMOS) transistor M1 represents switch SW1 and PMOS transistor M2 represents switch SW2. Switches SW3 and SW4 are full complementary metal oxide semiconductor (CMOS) switches. N-channel metal oxide semiconductor (NMOS) transistor M3 and PMOS transistor M4 together represent switch SW3, and PMOS transistor M5 and NMOS transistor M6 together represent switch SW4.

In an alternate embodiment, only PMOS transistors M4 and M5 are used for switches SW3 and SW4, respectively, i.e., transistors M3 and M6 are excluded. Typically, CMOS switches have more convenient levels for the signals used to control the transistor gates in the CMOS switch, than PMOS or NMOS switches. As a result, often they are preferred over PMOS or NMOS switches. However, in this embodiment of the present invention, the voltage levels are such that full CMOS switches are really not necessary.

Switches SW1–SW4 are voltage controlled. Voltage sources (not shown) output full CMOS 0–5 volt digital levels VIN1, VIN2 to switch the switches SW1–SW4. However, unlike the voltage signals V1, V2 used in the conventional current amplifier drivers 200, 300, these voltage levels VIN1, VIN2 do not have to be matched since they are only used for switching. In other words, the MOS transistor switches M1–M6 operate in either linear or cutoff regions, as opposed to the saturation region like PMOS transistors 203, 205 in the current amplifier circuit 200.

The voltage levels VIN1, VIN2 are either "high" or "low." These voltage levels are applied to the gates of transistors M1–M6, to control switches SW1–SW4, respectively. As used herein, the term "gate" broadly encompasses any form of control lead for changing the switching state of a device. As such, the term "gate" is intended to be synonymous with the "base" of a bipolar transistor, for example.

Figure 9:
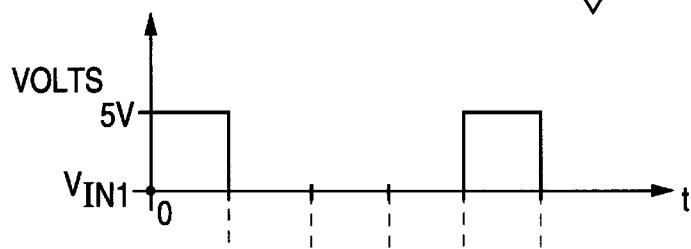
FIG. 9 is a timing diagram of the waveforms of control signals VIN1 and VIN2 and output signal Vout as used in the circuits of FIGS. 5, 7 and 8.
Figure 9:
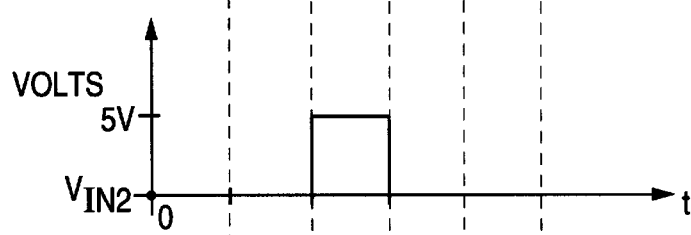
Figure 9:
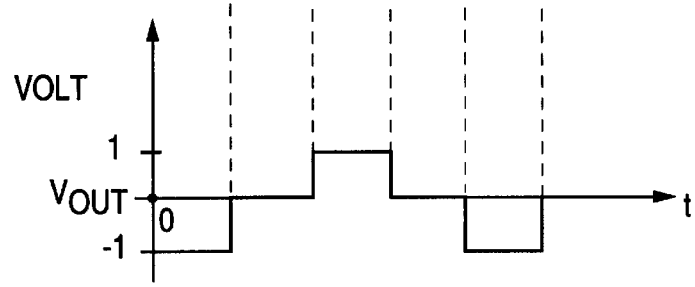

Referring to both FIGS. 5 and 9, operation of the current amplifier driver circuit 500 will now be explained. As illustrated in FIG. 5, inverters IV1–IV4 receive voltage signals VIN1, VIN2 which control the switching. FIG. 9 is a simplified timing diagram which illustrates the waveforms of voltage signals VIN1 and VIN2, and output voltage Vout. When the voltage signal VIN1, VIN2 is low (around 0 V), the output voltage from the inverters IV1, IV3 is high (equal to the supply voltage VDD). When the voltage signal VIN1, VIN2 is high (above a specified threshold voltage), the output voltage from inverters IV1, IV3 is low (around 0 V).

Looking at voltage signal VIN1, when the signal VIN1 goes high, as shown in FIG. 9, inverter IV1 outputs a low voltage signal which is applied to inverter IV2 and to the gates of transistor M2 (switch SW2) and transistor M4 (switch SW3). Since transistors M2 and M4 are PMOS transistors, they turn on when the low voltage signal is applied to their gates.

Inverter IV2 receives this same low voltage signal and outputs a high voltage signal which is applied to the gate of transistor M3. Since transistor M3 is an NMOS transistor, it turns on when the 5 volt signal is applied to its gate.

When both switches SW2 and SW3 turn on, transistor M7 sinks the DC current through the load resistor $R_L$ pulling the voltage at node OUT+ low and raising the voltage at node OUT−. The result is an output voltage Vout, equal to the voltage at node OUT+ minus the voltage at node OUT−, of approximately −1 volt, as shown in FIG. 9.

Conversely, when the voltage signal VIN1 goes low, as shown in FIG. 9, inverter IV1 outputs a high voltage signal which is applied to the gates of PMOS transistors M2 and M4, turning them off. Inverter IV2 inverts the high voltage signal to a low voltage signal which is applied to the gate of transistor M3, turning it off. Thus, switches SW2 and SW3 both turn off.

Looking at voltage signal VIN2, when signal also goes low, as shown in FIG. 9, both switches SW1 and SW4 turn off. Inverter IV3 outputs a high voltage signal which is applied to the gates of transistor M1 (switch SW1) and transistor M5 (switch SW4), and also to inverter IV4. Since transistors M1 and M5 are PMOS transistors, they turn off when the high voltage signal is applied to their gates. Inverter IV4 receives this same low voltage and outputs a high voltage signal which is applied to the gate of transistor M6, turning it off. Since both transistors M5 and M6 are off, switch SW4 turns off. Thus, switch SW4 and switch SW1, both turn off.

Since both voltage signals VIN1 and VIN2 are low, all the switches SW1–SW4 turn off. The voltages at node OUT− and OUT+ are then passively pulled up to the voltage supply $V_{DD}$, and the output voltage Vout is zero, as shown in FIG. 9. Transistor M7 goes into the linear region and the drain-to-source voltage ($v_{DS}$) of the transistor M7 goes to zero. However, the gate-to-source voltage ($v_{GS}$) of the transistor M7 is retained at the value needed to drive an output voltage Vout of +/−1.

Conversely, when voltage signal VIN2 goes high, both switches SW1 and SW4 turn on. Inverter IV3 outputs a low voltage signal which is applied to the gates of PMOS transistors M1 and M5 (switch SW4), turning them on. Inverter IV4 outputs a high voltage signal which is applied to the gate of NMOS transistor M6, turning it on. Since both transistors M5 and M6 turn on, switch SW4 turns on.

When both switch SW1 and switch SW4 turn on, transistor M7 sinks the DC current through the load resistor $R_L$ pulling the voltage at node OUT− low and the voltage at node OUT+ high. As a result, the output voltage Vout, equal to the voltage at node OUT+ minus the voltage at node OUT−, is approximately +1 volt, as shown in FIG. 9. Therefore, as illustrated in FIG. 9, the result of the switching operation is a composite ternery output voltage Vout waveform.

Although both voltage levels VIN1, VIN2 can go low at the same time, the voltage levels VIN1, VIN2 are never high at the same time. Thus, only one set of switches, either switches SW1 and SW4 or switches SW2 and SW3, turn on at a time.

A purpose of the present invention is for the switches SW1–SW4 to quickly switch the current coming from the current source 509 (e.g., in 3–5 nanoseconds or less).

Conventionally, current must be switched by switching a current source on and off. For example, the gates of transistors M7 and M8 would switch between a voltage level and ground, thereby switching the transistors on and off, which in turn would switch the current source 509 on and off.

The current amplifier circuit 500 provides a much faster way of switching the current coming from the current source 509. An advantage of the current amplifier driver circuit 500 is that the driver circuit 500 does not switch the current source 509 on and off. Rather, the current amplifier driver circuit 500 maintains the current source 509 at DC, and turns off all the switches SW1–SW4. As a result, even though the DC current source 509 remains on, once all of the switches SW1–SW4 are turned off, the voltage on the drain of output transistor M7 goes to zero (or circuit ground). Variations of the drain voltage of the output transistor M7, result in corresponding changes in the output current IDRIVE. Therefore, once the drain voltage goes to zero, the output current IDRIVE goes to zero, and no current flows into the common node COM. As a result, the current source no longer operates in the saturation region, but instead operates in the linear region. At this point, since the current source 509 is always kept on, the current amplifier driver circuit 500 maintains a constant drive voltage on the drive node DRV, and the current source 509 behaves like a small resistor. However, once switches SW1 and SW4, or switches SW2 and SW3 turn on, the current source 509 rapidly ramps up because now it has the full drive voltage on the gates of the transistors M7 and M8, and begins behaving like a current source.

In this embodiment, the amplifier driver circuit 500 operates in digital mode. However, it will be appreciated that the amplifier driver circuit 500 can also be used in analog applications.

Figure 6:
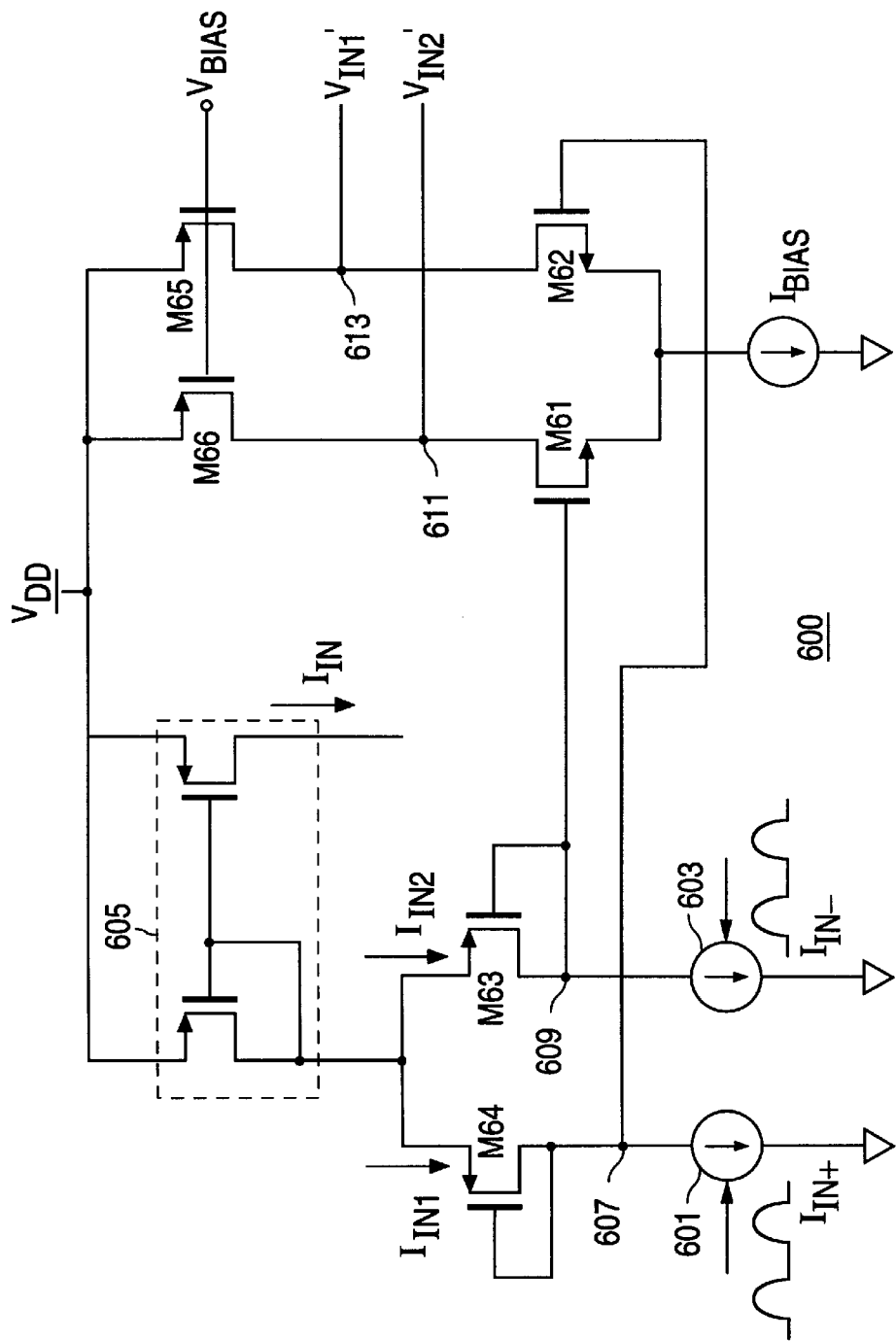
FIG. 6 illustrates a schematic diagram of a second embodiment of a fully switched current amplifier driver in accordance with the present invention.

Additional circuitry is used, as shown in FIG. 6, for the current amplifier driver circuit 500 to operate in the analog mode, for example, 10 megabits/second operation. An analog circuit 600 generates both the input current signal IIN and voltage signals VIN1' and VIN2' used to operate the amplifier driver circuit 500.

The analog circuit 600 includes two current sources 601 and 603 which provide input current IIN1 and IIN2, two PMOS transistors M64, M63, a current mirror current source 605 which outputs current IIN, and a comparator circuit 615 which generates voltage signals VIN1', VIN2'.

Signal generators (not shown) provide input signals $I_{IN+/-}$ to current sources 601 and 603, respectively. The input signals $I_{IN+/-}$ are half-wave rectified, and 180 degrees out of phase from one another, i.e., $I_{IN+}$ is 180 degrees out of phase from $I_{IN-}$. As a result, when the current source 601, 603 receives a signal, that particular current source becomes active, and when it does not receive a signal the current source is inactive. The effect of this arrangement is for current sources 601 and 603 to alternate between "active" and "inactive" states, such that only one current source is active at a given time.

The comparator circuit 615 includes two NMOS transistors M61 and M62 in a differential pair configuration. The sources of the differential pair transistors M61, M62 couple together and are biased by a constant current source $I_{BIAS}$. The gate of transistor M61 couples to the output of current source 603 and to the gate and drain of PMOS transistor M63. The gate of transistor M62 couples to the output of current source 601 and to the gate and drain of PMOS transistor M64. Two PMOS transistors M65, M66 provide a load for the differential pair M61, M62. The gates of these transistors M65, M66 couple to a voltage VBIAS, the sources of the transistors couple to the voltage supply VDD, and the drain of transistor M66 couples to the drain of transistor M61 while the drain of transistor M65 couples to the drain of transistor M62.

The analog circuit 600 operates as follows. When input signal $I_{IN+}$ goes high, current source 601 is active and therefore, input signal $I_{IN-}$ goes low so current source 603 is inactive. Since current source 601 is on, the voltage applied to the gate of transistor M64 is low, turning this transistor M64 on. Similarly, since current source 603 is off, the voltage applied to the gate of transistor M63 is high, keeping this transistor M63 off. Only current IIN1 flows into current source 605, which outputs current IIN.

Current IIN1 is summed with current IIN2 at the input of current source 605 to generate current IIN which is the input current for either the current amplifier circuit 500 or 600. Since either current IIN1 or current IIN2 will have a positive amplitude, the current IIN maintains a positive amplitude.

When current source 601 is on and current source 603 is off, the voltage at node 609 is high and the voltage at node 607 is low. As a result, NMOS transistor M61 turns on, causing the voltage VIN2' at node 611 to go low, and NMOS transistor M62 turns off, causing the voltage VIN1' at node 613 to go high. These voltage signals VIN1', VIN2' are then applied to the inverters IV1–IV4 to provide full digital CMOS levels to switch the switches SW1–SW4.

However, unlike voltage signals VIN1 and VIN2 which switch one at a time, voltage signals VIN1', VIN2' both switch at the same time. Since VIN1' is high, switches SW2 and SW3 turn on, and the current IIN is steered in the direction indicated by arrow A to generate a positive voltage across the resistive load $R_L$.

Conversely, when input signal $I_{IN-}$ goes high current source 603 is active, and therefore, input signal $I_{IN+}$ goes low so current source 601 is inactive. Since current source 603 is on, the voltage applied to the gate of transistor M63 is low, turning this transistor M63 on. Similarly, since current source 601 is off, the voltage applied to the gate of transistor M64 is high, keeping this transistor M64 off. Only current IN2 flows into current source 605, which outputs current IIN.

When current source 603 is on and current source 601 is off, the voltage at node 607 is high and the voltage at node 609 is low. As a result, NMOS transistor M62 turns off, causing the voltage VIN2' at node 611 to go high, and NMOS transistor M62 turns on, causing the voltage VIN1' at node 613 to go low. Since VIN2' is high, switches SW1 and SW4 turn on, and the current IIN is steered in the direction indicated by arrow B to generate a negative voltage across the resistive load $R_L$.

There are some disadvantages to operating in the analog mode. Because the generated voltage signals VIN1' and VIN2' are not exactly in phase with the input signal IIN, some delay results. A first delay results from the dead time of the voltage signals VIN1' and VIN2' between high and low levels. The second delay results from the dead time when the switches SW1–SW4 have to switch. These delays cause distortion. But, for an analog operation, or other applications where distortion is not an issue, this analog circuit 600 is good for driving high speed signals using low power.

Referring again to FIG. 5, due to the internal capacitive effects of output transistors M3–M7, which is the capacitance seen at the common node COM, the output voltage Vout of the circuit 500 does not reach its final value in zero time. To illustrate this point, consider the current amplifier circuit 500 driven by an ideal pulse (zero rise and fall times).

The first input pulse goes from low to high at time t=0. Just prior to the leading edge of the input pulse (that is at time t=0−) all the switches SW1–SW4 are off. Therefore, the output voltage Vout equals zero (0) and the capacitance of the output transistors M3–M6 is discharged all the will to zero (0).

At time t=0, the input voltage signal rises to the voltage supply VDD. But, when the switches SW1 and SW4, or the switches SW2 and SW3, turn on at t=0, the capacitor voltage of the output transistors M5 and M6, or transistors M3 and M4, and therefore the capacitance seen at the common node COM, cannot change instantaneously. Rather, the voltage will rise exponentially. When voltage signals are applied to the gates of the MOS transistors to turn the switches SW1–SW4 on, the input voltage rises from the negative (or zero) level to the positive level, but the output voltage Vout does not respond immediately. Rather, a delay time td elapses before any appreciable source current begins to flow in the resistive load $R_L$. This delay time is required for the output current IDRIVE supplied through the resistances of the switches SW1–SW4 to charge up the capacitance associated with the output transistors M3–M7. The time required to charge the capacitance is the first rise time. Thus, the rise time is controlled by the capacitance seen at the node COM, the load capacitance, and the resistances of the switches SW1–SW4. As a result, the rise time is a measure of the switching speed of the current amplifier driver circuit 500.

When the input voltage returns to the low level (0 V), a charge is no longer applied to the gate of the transistors so the switches SW1 and SW4, or switches SW2 and SW3, turn off. As a result, the output current IDRIVE begins to fall exponentially with a time constant determined by the load capacitance, the junction capacitances of transistors M1–M6, and resistive load $R_L$. The capacitance seen at the common node COM discharges into the drive node DRV through the switch resistances.

In another embodiment, a large capacitance CBIG is used to quiet the drive node DRV. Ideally, the drive node DRV remains at a constant DC voltage. When both of the voltage signals VIN1 and VIN2 are low, zero current flows into the common node COM. However, once one of the voltage signals VIN1, VIN2 goes high, two of the switches (either switches SW1 and SW4, or switches SW2, SW3) turn on causing the common node COM to ramp up. This transition causes some charge to be injected into the drive node DRV. As a result, the large capacitance CBIG is used to dissipate these charge injections, such that the drive node DRV only receives DC voltage.

One concern is the issue of the symmetry of the rise and fall times within one waveform.

Both the positive and negative voltage drops across the resistive load $R_L$ have a rise time and a fall time. Since the amplifier driver circuit 500 is symmetric (the MOSFETs are matched) and there is only one current source 509, the rise and fall times of the output waveforms should be equal. The amount that the output voltage Vout is swinging is always the same.

However, even if the rise and fall times differ, the drive capability of this amplifier driver circuit 500 is so large that the rise and fall times are very small. The circuit 500 is designed such that the inherent rise and fall times of the waveforms, those which are dependent upon the transistor fabrication process, are symmetric within one-half of a nanosecond. Thus, even if the rise and fall times are not matched, the resulting rise time is one half of a nanosecond plus the operating rise time, which may be 3–5 nanoseconds. Since, the rise and fall times are calculated by squaring the inherent rise time, squaring the operating rise time, and taking the square root of the sum of the two squared values, these rise and fall times reduce to small values.

A capacitor CL can be coupled across the load resistance $R_L$ to form a filter with a time constant of $R_L * C_L$ to increase the rise and fall times of the amplifier driver circuit 500. This time constant is much larger than the time constant formed at the common node COM. Therefore, only the time constant $R_L * C_L$ is seen, as the time constant formed at the common node COM is negligible in comparison. Although in this embodiment a capacitor $C_L$ is used to increase the rise and fall times of the circuit, it will be appreciated that other circuit techniques can be used.

There are several advantages to the design of the amplifier driver circuit 500. First, since only one current source is used, the circuit takes up less area on a silicon chip. Second, there are no asymmetry problems. Only one current source is used and because voltage signals VIN1, VIN2 are used, both the positive and negative sides of the waveform are symmetrical. So, since there is only one current source 509, and only one load $R_L$, the peak voltage value is always going to be the same, equal to the current IBG through the load $R_L$ times the resistance. Therefore, by design, there is no asymmetry in the voltage levels.

Figure 7:
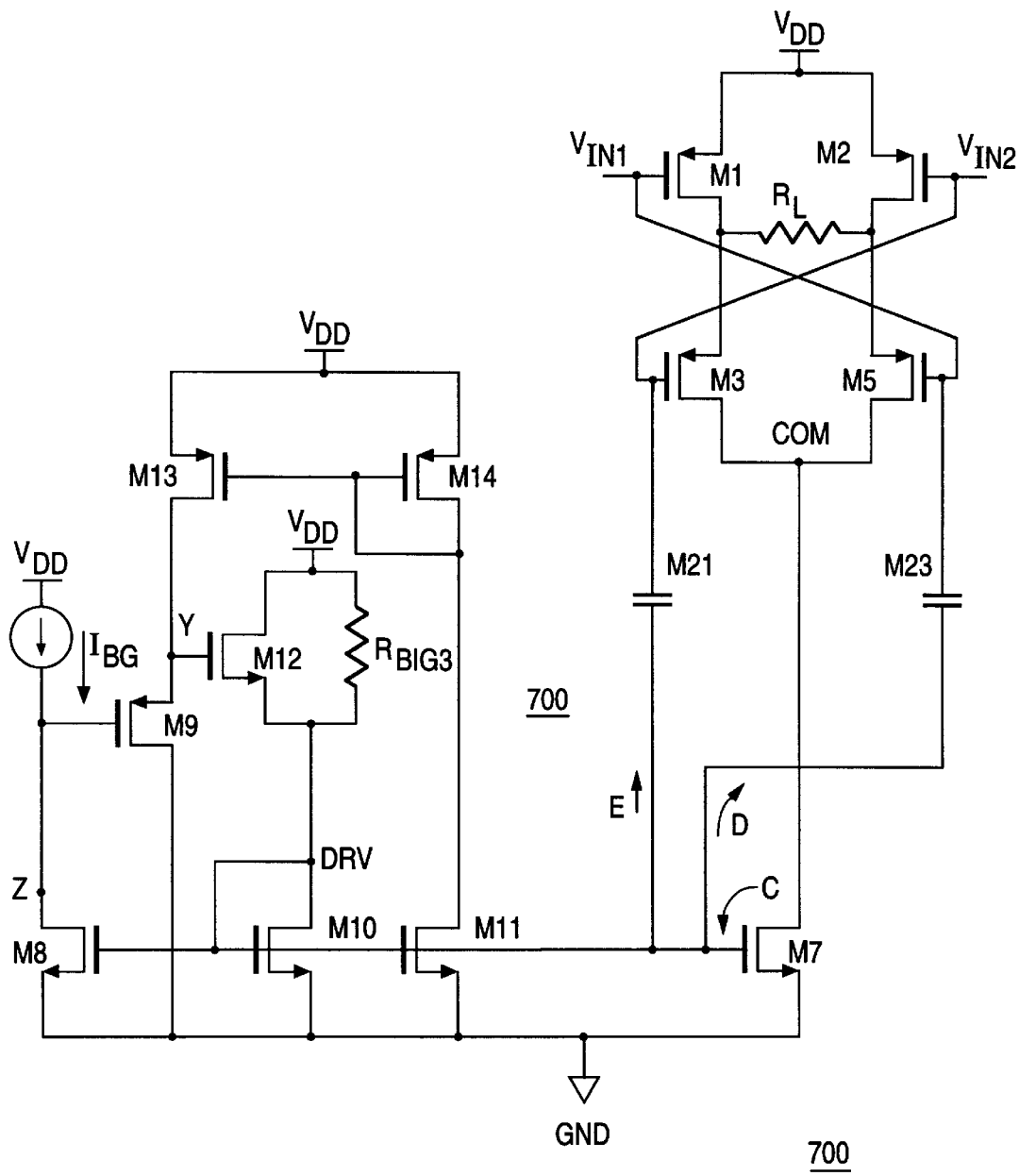
FIG. 7 illustrates a schematic diagram of a third embodiment of a fully switched current amplifier driver in accordance with the present invention.

FIG. 7 illustrates an alternate embodiment of the present invention. The large capacitance CBIG used in the current amplifier driver circuit 500 to reduce the voltage rise it the drive node DRV when charge is injected into the current source 509, can be impractical. Therefore, current source 701 is substituted for current source 509 to lower the impedance seen at the input node DRV'.

Current source 701 also provides more input voltage headroom. Referring again to FIG. 5, the bandgap circuit typically requires approximately 1.5 volts for its operation. However, in some conditions the voltage drop at the input of circuit 500 can be as high as 4.0 volts. When the voltage supply VDD is 4.5 volts, this leaves only approximately 0.5 Volt for operation of the bandgap circuit. Thus, the current amplifier driver circuit 700, as shown in FIG. 7, is designed so that it can operate with just an overdrive voltage ΔV across the drain and source of the transistor M8, thereby allowing for extra input voltage headroom.

Operation of current source 701 is as follows. The bandgap current IBG is received by transistor M8. Once the voltage on the gate of transistor M8 is raised above the threshold voltage, the bandgap current IBG flows through transistor M8. This current causes the gates of transistors M10 and M11 to come to the same voltage level. The current is then mirrored lay transistor M11, and then transistor M14 into transistor M13. Thus, transistor M13 has some multiple of the bandgap current IBG flowing into it. The current source 701 also reduces the effect of charge injection at the drive node DRV'. In the current amplifier circuit 500, as shown in FIG. 5, when charge is directly injected into the gate of transistor M8, the drive node DRV sees ringing. Thus, any change in voltage at the drive node DRV is going to directly affect the current. To reduce this problem, transistors M9 and M12 in current source 701 form two buffers which isolate the drive node DRV' from the input node Z. As a result, any ringing on the drive node DRV' does not directly affect the gate of transistor M9 which is the input node Z. Resistor RBIG3 couples across transistor M12 and voltage supply VDD for initial start-up of the circuit 700. This resistor RBIG3 forces residual current into transistor M10 to enable the transistor M10 to remain on.

As explained above, ideally, the drive node DRV' remains at a constant DC voltage. When both of the input voltage signals VIN1 and VIN2 are low, zero current flows into the common node COM. However, once one of the voltage signals VIN1, VIN2 goes high, two of the switches SW1–SW4 turn on causing the common node COM to ramp up. This transition causes some current to be injected into the drive node DRV'. It is possible to cancel the effect of the charge injection at the drive node DRV' by injecting an opposite charge.

To minimize these charge injections, capacitors M21, M23, which can also be transistors, are used. When charge is injected from the common node COM in the direction indicated by arrow C, then capacitors M21, M23 take away current in the direction indicated by arrows D and E, but not at the same time. Capacitors M21 and M23 couple between the drive node DRV' and the voltage signal VN1, VIN2 input nodes. As shown in FIG. 7, capacitor M21 couples between the gate of the output transistor M7 and the gate of transistor M3, and capacitor M23 couples between the gate of the output transistor M7 and the gate of transistor M5.

Figure 8:
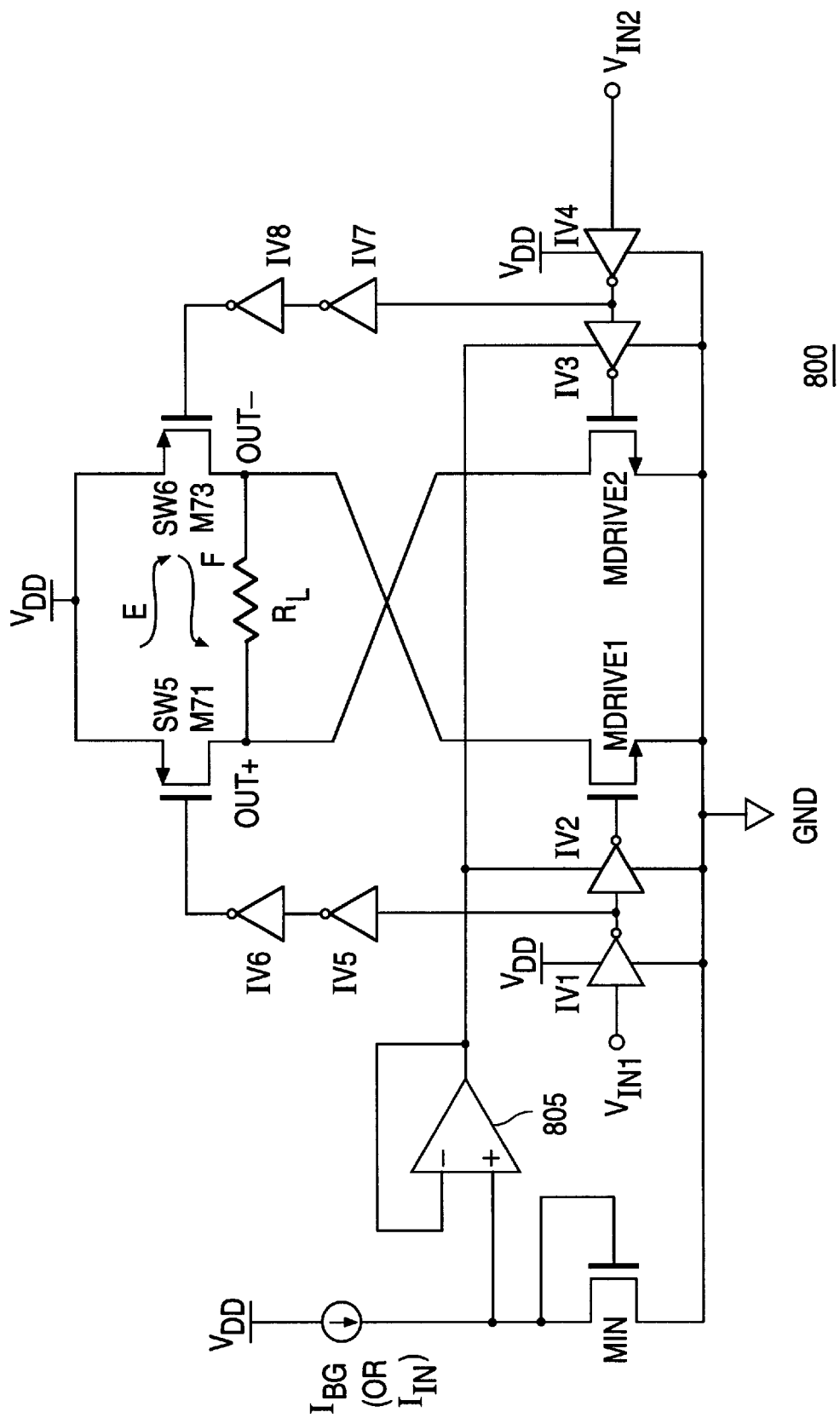
FIG. 8 illustrates a schematic diagram of a fourth embodiment of a fully switched current amplifier driver in accordance with the present invention.

FIG. 8 illustrates a third embodiment of the present invention. Direct current IBG is input into the input transistor MIN. The output of transistor MIN is input to the unity gain amplifier 805. The output of the unity gain amplifier drives the output transistors MDRIVE1, MDRIVE2. The two PMOS transistors M71, M73 steer current through the resistive load $R_L$.

One disadvantage of the current amplifier driver circuits 400, 500 and 700, is the difficulty of switching such a small current into a large capacitance of the output transistors M3–M7. In the preferred embodiments, all of the amplifier driver circuits 400, 500 and 700, are driving a 20 mA current. As a result, the output transistors M3–M6 need to be sized such that the large gate capacitance of these output transistors M3–M6 is fixed. Charging the output transistors M3–M6 to a higher voltage level using a current source, just yields a linear rise time. Also, since the input current is small (e.g., 100–200 microamperes), the rise time, and therefore the speed of the amplifier driver circuit, is slow.

The most effective way to speed up the current amplifier driver circuits 400, 500 and 700 would be to input more current. However, inputting more current reduces the gain of the circuit, which is also unacceptable. A more effective solution is to use a voltage driven current amplifier circuit 800. Since the desired output levels are known, output voltages Vout equal to ±1, or 0, the voltage level on the drive node DRV required to generate these output voltages is computed. Then, a voltage source (not shown) inputs these required voltage levels VIN1, VIN2; into the output transistors MDRIVE1, MDRIVE2. Since the voltage source has a much smaller output impedance, the capacitance of the output transistors MDRIVE1, MDRIVE2 can charge up very fast.

Operation of the voltage driven current amplifier circuit 800 will now be explained. A direct current IBG (or if operating in the analog mode, current IIN is provided by the analog circuit 600) is input into input gain transistor MIN to generate a voltage signal. This voltage signal is then amplified by a unity gain amplifier 805 to drive the gates of the two output transistors MDRIVE1, MDRIVE2.

The same voltage levels VIN1 and VIN2 combined with inverters IV1–IV4, control the switching of the two PMOS switches SW5 and SW6, and the drive transistors MDRIVE1, MDRIVE2. The two PMOS switches SW5 and SW6 (transistors M71 and M73, respectively) steer current. When the voltage signal VIN1 goes high, PMOS switch SW5 and output transistor MDRIVE1 turn on. Therefore, the current flows in the direction indicated by arrow E to generate a positive voltage across the resistive load $R_L$. When both voltage levels VIN1, VIN2 are low, no current flows into the resistive load $R_L$. Then, when voltage source VIN2 goes high, PMOS switch SW6 and output transistor MDRIVE2 turn on. Therefore, the current flows in the direction indicated by arrow F to generate a negative voltage across the resistive load $R_L$. Therefore, similar to the output voltage Vout of amplifier driver circuit 500, as shown in FIG. 9, the output voltage Vout of amplifier driver circuit 800 has both positive and negative voltage levels.

Inverters IV2 and IV3 are unique in that the node on the inverter IV2, IV3 that typically couples to the positive supply rail, instead couples to the output of the unity gain amplifier 805. Therefore, the voltage levels VIN1, VIN2 switch the gates of the output transistors MDRIVE1, MDRIVE2 between circuit ground GND and the output of the unity gain amplifier 805. Thus, when the voltage level VIN1, VIN2 goes low (to circuit ground GND), the output transistors MDRIVE1, MDRIVE2 turn off, and no current flows to the output transistors MDRIVE1, MDRIVE2. When either voltage level VIN1 or VIN2 goes high (to voltage supply VDD), either inverter IV2 or IV3, respectively, turns on. This causes the gain multiplied by the input current IBG (or IIN) to flow into the output transistor MDRIVE1, MDRIVE2. For example, if the size of transistor MIN is 1, and the size of the output transistor MDRIVE1 is A, then output transistor MDRIVE1 will have input current IBG multiplied by A*1 flowing into it.

Inverters IV5–IV8 are used for delay matching. It is desirable that the PMOS transistors M71 and the corresponding output transistor MDRIVE2 switch at the same time, and also that PMOS transistor M73 and the corresponding output transistor MDRIVE1 switch at the same. Since there is still a capacitance that needs to be charged, the output transistors MDRIVE1, MDRIVE2 switch slower than the PMOS transistors M71, M73. Therefore, the inverters IV5–IV8 provide some delay in the switching of the PMOS switches M71, M73.

There are several advantages to this voltage driven amplifier circuit 800. First, typically the gate of input transistor MIN is connected to the gates of output transistors MDRIVE1, MDRIVE2. However, in circuit 800, the output of transistor MIN goes through a unity gain amplifier 805 and then connects to the gate of the output transistors MDRIVE1, MDRIVE2 through inverters INV2 and INV3. Thus, the gates of output transistors MDRIVE1, MDRIVE2 are charged through a low impedance source, thereby causing the output to move very fast.

Second, the voltage driven amplifier circuit 800 reduces matching issues. Although the circuit 800 still uses two output transistors MDRIVE1, MDRIVE2 (transistors M4 and M5 in current amplifier driver circuits 400, 500, and 700), there is only one input transistor MIN, rather than two (transistors M7 and M8). Thus, only three transistors (MDRIVE1, MDRIVE2 and MIN) rather than four transistors (transistors M7, M8, M4 and M5), as in the other current amplifier driver circuits 400, 500, and 700, need to be matched.

Finally, the voltage driven current amplifier circuit 800 provides high drive capability because the circuit uses voltage sources to drive the gate of the output transistors MDRIVE1, MDRIVE2.

In the preferred embodiment, the circuit operates in digital mode. However, it will be appreciated that by using analog circuit 600, as shown in FIG. 6, to generate the voltage levels VIN1, VIN2, the voltage driven current amplifier circuit 800 can operate in the analog mode (e.g., 10 megabits per second operation).

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus including a current driving circuit for providing a tri-level differential signal to a load, said current amplifier driver circuit comprising:

first and second output nodes configured to couple to an external circuit and convey first, second and zero output drive signals;

a first resistive circuit, coupled to said first output node and configured to receive a first control signal;

a second resistive circuit, coupled to said first output node and configured to receive a second control signal;

a third resistive circuit, coupled to said second output node and configured to receive said second control signal;

a fourth resistive circuit, coupled to said second output node and configured to receive said first control signal;

an input transistor coupled to the second resistive circuit to form a first switching current source, and coupled to the fourth resistive circuit to form a second switching current source, said first and second switching current sources configured to receive a first input signal and in accordance therewith provide a drive signal; and a buffer circuit coupled between the input transistor and the first and fourth resistive circuits, wherein:

said first and second control signals have active and inactive signal states;

said first and fourth resistive circuits convey said drive signal in a first direction in accordance with said first control signal active state, thereby generating said first output drive signal;

said second and third resistive circuits convey said drive signal in a second direction in accordance with said second control signal active state, thereby generating said second output drive signal;

said first, second, third and fourth resistive circuits cease conveying said drive signal when each of said first and second control signals have an inactive signal state, thereby generating a zero output drive signal; and said first, second and zero output drive signals together form at said first and second output nodes a tri-level differential output signal which is proportional to a difference of said first control signal and said second control signal.

2. The apparatus of claim 1, wherein said first and second resistive circuits comprise first and second selectively conductive circuits with first and second conductivities which correspond to said active and inactive states of said first and second control signals, respectively, and wherein said first conductivity is higher than said second conductivity.

3. The apparatus of claim 1, wherein said third and fourth resistive circuits comprise first and second selectively conductive circuits with first and second conductivities which correspond to said active and inactive states of said second and first control signals, respectively, and wherein said first conductivity is higher than said second conductivity.

4. The apparatus of claim 1, further comprising a fifth resistive circuit coupled between said first and second output nodes and configured to further convey said first, second and zero output drive signals and thereby provide said tri-level differential output signal.

5. A method of providing a tri-level differential signal to a load, said method comprising the steps of:

generating a drive current;

receiving a first control signal and a second control signal, said first and second control signals having active and inactive signal states, and in accordance therewith generating first, second and third output drive signals;

sinking said drive current in a first direction when said first control signal has an active signal state and said second control signal has an inactive signal state, thereby generating the first output drive signal;

sinking said drive current in a second direction when said first control signal has an inactive signal state and said second control signal has an active signal state, thereby generating the second output drive signal;

suspending said drive current when each of said first and second control signals have an inactive signal state, thereby generating the third output drive signal; and conveying said first, second and third output drive signals via first and second output nodes which are coupled to an external circuit, wherein said first, second and third output drive signals together form at said first and second output nodes a tri-level differential output signal which is proportional to a difference of said first control signal and said second control signal.

6. The method of claim 5, wherein the step of suspending said drive current when each of said first and second control signals have an inactive signal state, thereby generating the third output drive signal comprises ceasing to conduct said drive current when said first and second control signals have an inactive signal state, thereby generating the third output signal having a zero value.

7. The method of claim 5, wherein said step of conveying said first, second and third output drive signals via first and second output nodes which are coupled to an external circuit comprises:

establishing first and second conductivities of first and second selectively conductive circuits, wherein said first conductivity is higher than said second conductivity;

establishing first and second conductivities of third and fourth selectively conductive circuits, wherein said first conductivity is higher than said second conductivity;

conveying said first output drive signal to said first output node via said first and second selectively conductive circuits, when said first and second selectively conductive circuits have said first conductivity;

conveying said second output drive signal to said second output node via third and fourth selectively conductive circuits, when said third and fourth selectively conductive circuits have said first conductivity; and conveying said third output drive signal to said first and second output nodes when said first, second, third and fourth selectively conductive circuits have said second conductivity.

8. A method of providing a tri-level differential signal to a load, said method comprising the steps of:

generating a drive current;

activating a first switching circuit and in accordance therewith conducting said drive current in a first direction, thereby generating a first output drive signal;

activating a second switching circuit and in accordance therewith conducting said drive current in a second direction, thereby generating a second output drive signal;

deactivating said first and second switching circuits and in accordance therewith suspending said drive current, thereby generating a third output drive signal having a zero value; and conveying said first, second and third output drive signals via first and second output nodes which are coupled to an external circuit, wherein said first, second and third output drive signals together form at said first and second output nodes a tri-level differential output signal.

* * * * *